United States Patent [19]

Smith

[11] Patent Number: 4,879,507

[45] Date of Patent: Nov. 7, 1989

[54] NOISE MEASUREMENT PROBE

[75] Inventor: Douglas C. Smith, Rumson, N.J.

[73] Assignees: American Telephone and Telegraph Company, New York, N.Y.; AT&T Information Systems Inc., Morristown, N.J.

[21] Appl. No.: 289,288

[22] Filed: Dec. 23, 1988

[51] Int. Cl.[4] ............................................. G01R 19/55
[52] U.S. Cl. .................................. 324/57 N; 324/72.5
[58] Field of Search .................... 324/57 N, 475, 72.5, 324/67, 258, 326, 238; 343/842, 741, 866, 792, 843

[56] References Cited

U.S. PATENT DOCUMENTS

| | | | |
|---|---|---|---|
| 3,534,371 | 10/1970 | Seavey | 343/792 |
| 4,477,770 | 10/1984 | Tojo | 324/57 N |
| 4,539,709 | 9/1985 | Conner | 324/57 N X |
| 4,593,247 | 6/1986 | Viertl et al. | 324/238 |
| 4,611,214 | 9/1986 | Campbell et al. | 343/834 X |

FOREIGN PATENT DOCUMENTS 744116 2/1956 United Kingdom ................. 343/866
2074737 11/1981 United Kingdom ............. 324/57 N Primary Examiner—Reinhard J. Eisenzopf
Assistant Examiner—Robert W. Mueller
Attorney, Agent, or Firm—David R. Padnes

[57] ABSTRACT

A probe for providing noise measurements of an electrical circuit includes at least one loop of wire connected to a plurality of conductors. The loop interconnects one or more signal-carrying ones of the conductors to one or more of the conductors carrying ground and has a portion which is substantially straight or is deformable to follow the path of a conductor in the electrical circuit. Preferably, the loop is formed so that this straight portion terminates in a right angle bend at each end. This loop serves as an inductive pickup which avoids the need for contact of the probe to the circuit under test and, thereby, provides more accurate noise measurements.

14 Claims, 3 Drawing Sheets

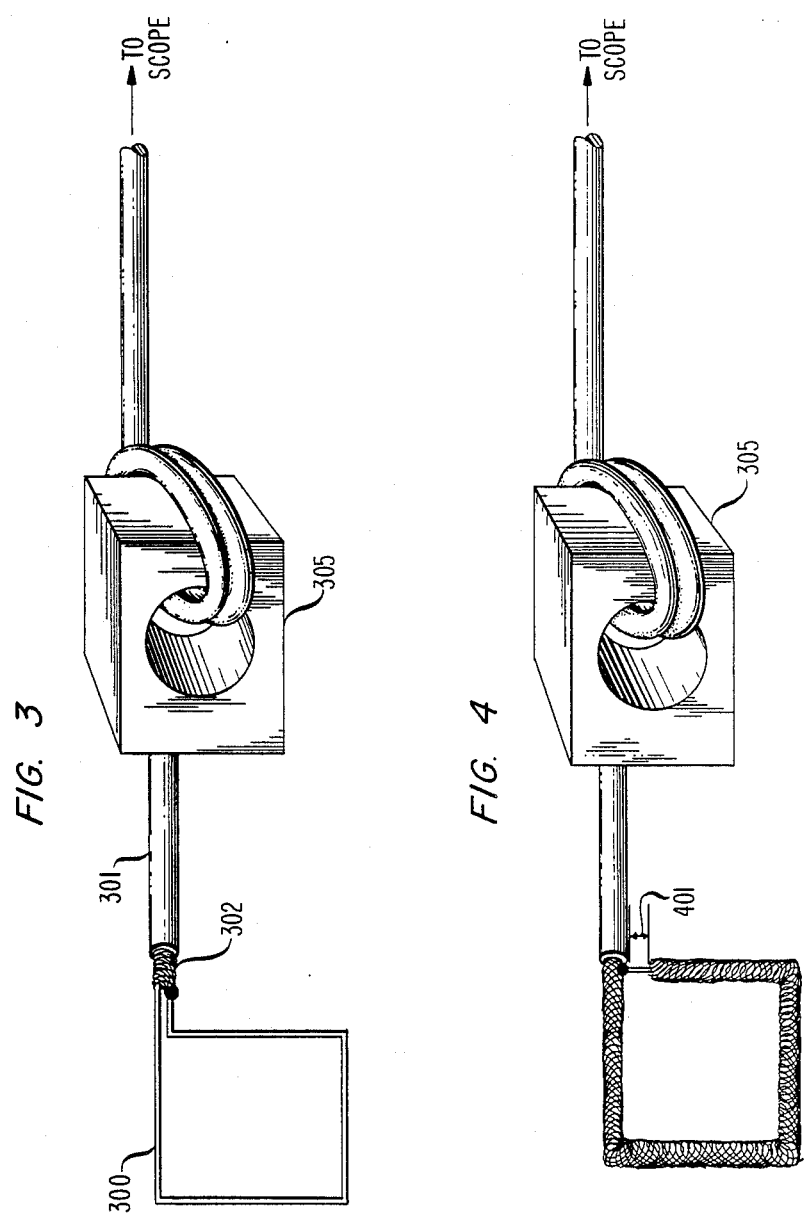

NOISE MEASUREMENT PROBE

TECHNICAL FIELD

The present invention relates to the field of electrical measurement devices and, more particularly, to a probe which improves the accuracy of a noise measurement made with a given test instrument.

BACKGROUND OF THE INVENTION

Noise is an unwanted by-product of electronic circuit operation. It is especially troublesome in digital circuits and power switching circuits. While it is impossible to completely obliterate noise, it is possible through careful circuit design to reduce the quantum of noise to a level which does not interfere with satisfactory circuit operation in a particular application. Of course, reducing noise to lower and lower levels incurs substantially increasing costs. Accordingly, in designing circuits, and especially digital and power switching circuits, it is important to quantify the noise present in any circuit and, in certain applications, determine any significant noise source in the circuit so that the most effective noise reduction steps can be implemented. In other applications, it is desirable to inject noise into a circuit under test to determine the noise margin, i.e., the amount of additional noise which must be added before circuit operation ceases to meet prescribed performance objectives. This margin is important, as it sets guidelines on the environment in which a circuit may operate.

Prior art techniques to measure noise rely on direct connection or physical contact between the probe leads of an oscilloscope or multimeter and the circuit under test. Injection of noise signals was also accomplished through direct connection of a signal generator and the circuit under test. The problem with this technique is that the resulting measurements will vary with the location at which the ground connection of the probe is affixed. In addition, direct connection of the probe as a means of injecting noise is not always possible without disturbing circuit operation to such an extent as to render any measurements meaningless. In light of the foregoing, improvements in the apparatus for noise measurements would be extremely desirable.

SUMMARY OF THE INVENTION

What I have realized is that the variations in noise signal measurements in the prior art are caused by a current flow in the ground lead of the measurement probe. In addition, it is this current flow which can produce alterations in the operation of the circuit under test. Pursuant to the present invention, the limitations of the prior art are overcome through the use of a noise probe which allows noise measurements to be made and noise to be injected into a circuit under test without physical contact of the noise probe. This lack of contact between the noise probe and the circuit under test eliminates the error-causing current flow.

The noise probe, in accordance with the present invention, includes a plurality of conductors with at least one conductor carrying a signal and at least one other conductor carrying ground. One end of these conductors is adapted for connection to measurement or signal generating equipment and another end merges with a conductive loop. The loop interconnects the signal-carrying conductors with those connected to ground and is formed with a segment in which a signal can be induced. In one embodiment, this segment is straight. In another embodiment, the loop segment is fabricated to be deformable so that it can be distorted to follow the path of a conductor in the circuit being measured. In either embodiment, the ends of the segment preferably interface the rest of the loop through substantially right angle bends. In addition, in either embodiment, the ground-carrying conductors may cover substantially all of the loop to provide electric field shielding. Or, in either embodiment, the conductors may be wrapped a few times through a ferrite core to form a low-pass filter for longitudinal ground shield currents.

BRIEF DESCRIPTION OF THE DRAWING

FIG. 3 is a representation of one embodiment of the present invention;

FIG. 4 is a representation of an alternate embodiment of the present invention.

DETAILED DESCRIPTION

Figure 1:
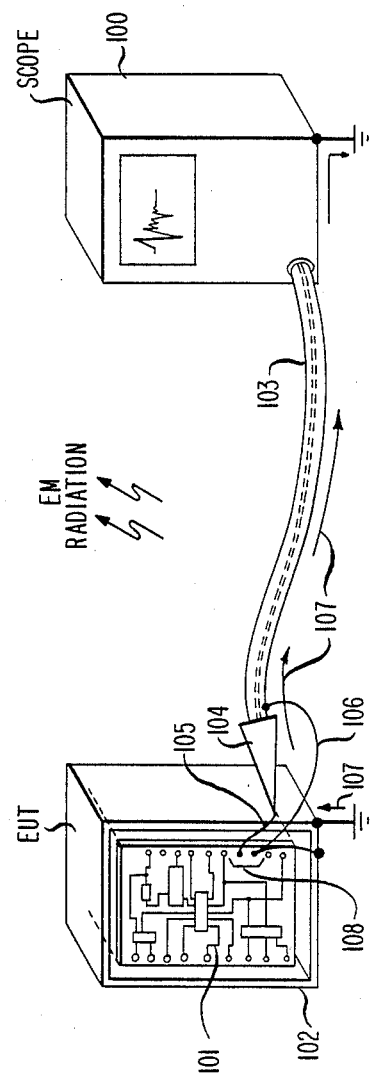
FIG. 1 is a diagram for understanding how the present invention operates to improve the accuracy of an illustrative noise measurement.

FIG. 1 illustrates how a significant amount of error occurs when measurements are made of a circuit under test using prior art techniques. As shown, oscilloscope 100 is connected to a circuit 101, mounted within a grounded chassis 102, via a coaxial cable 103 which terminates in a probe tip 104.

Probe tip 104 includes a signal conductor 105 and a ground conductor 106 which are respectively connected to the center conductor and ground shield of the coxial cable. Conductors 105 and 106 are both connected to the circuit under test. With these connections, a noise current, as illustrated by arrow 107, flows between the circuit under test and the scope chassis along the ground connection. As this noise current flows through the ground path between the circuit and the oscilloscope, a noise voltage is induced in the ground lead of the probe and the shield of the coaxial cable. As a result, the oscilloscope displays the sum of the voltage around a closed loop extending from the oscilloscope. This loop is defined by the series connection of the center conductor of the coaxial cable and signal lead 105, the voltage differential 108 between the ends of the conductors 105 and 106, which is the desired measurement, the ground conductor 106 and ground shield of the coaxial cable. The current in the ground shield of the coaxial cable produces a voltage differential through the ground shield and, due to mutual inductance, induces a voltage differential through the center conductor of the coaxial cable that cancels the voltage appearing in the ground shield. Inasmuch as the center conductor and ground shield of the coaxial cable are tightly coupled, there is good voltage cancellation. The voltage drop across the ground lead 106 is not cancelled, however, and appears as a noise voltage in series with the voltage differential 108 which is to be measured. This added voltage drop is especially troublesome as it can substantially exceed, and thereby mask, the voltage differential 108 which is to be measured.

To overcome this error, the noise probe, in accordance with the present invention, utilizes an inductive pickup loop which eliminates the need to contact the circuit under test.

Before proceeding further, it is perhaps desirable to review some basic circuit theory. As is well-known, mutual inductance, or transformer action, occurs between any two wires that are in close proximity to one another. For example, for first and second wires in close proximity to one another with the first wire carrying some time-varying current i(t), there is a voltage drop induced in a second wire which can be expressed as:

$$e(t) = M(di(t)/dt) \quad (1)$$

where di(t)/dt is the first derivative of the current with respect to time and M is the mutual inductance between the wires and is given by:

$$M = K\sqrt{L_1 L_2} \quad (2)$$

where $L_1$ and $L_2$ are the inductances per unit length of the first and second wires, respectively, and K, the coefficient of coupling between the wires, is a number equal to or greater than 0 and less than or equal to 1. Since $L_1$, $L_2$ and K are constants, M is also a constant. Therefore, the induced voltage e(t) per unit length in the second wire will have the same waveshape as that in the first wire. Moreover, for applications where $L_1 = L_2$, the magnitude of the induced voltage in the second wire will be equal to or less than the magnitude of the voltage drop across each unit length of the first wire.

Figure 2:
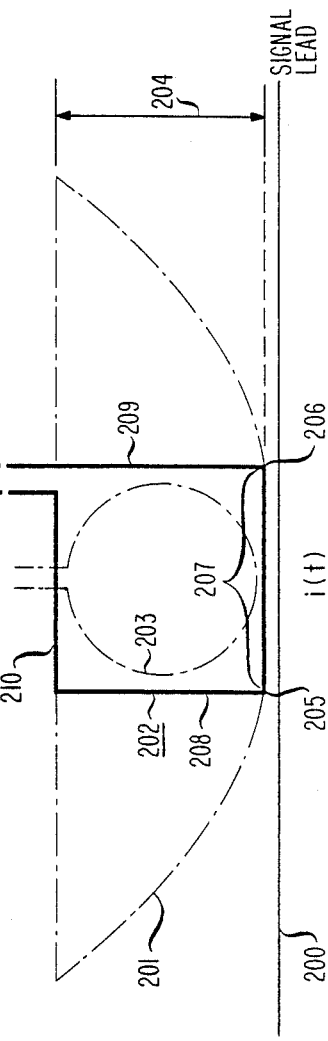
FIG. 2 is a diagram useful in understanding the effect of the shape of the loop on the operation of the present invention.

Refer back now to FIG. 2 in light of the foregoing theory. In order to maximize e(t), it is necessary to position the pickup loop of the probe as close as possible to the signal carrying wire. As little as an eighth of an inch separation will substantially reduce the loop response. The shape of the pickup loop is also important. Refer now to FIG. 2 which shows three illustrative pickup loops 201, 202 and 203 which are disposed in close proximity to a signal-carrying wire 200. For any given loop size, the most desirable loop shape is one which maximizes the voltage induced in the loop from a current flow in wire 200 and at the same time defines with certainty the unit length of the induced voltage. A square, such as loop 202, or other rectilinear shape are the shapes that have been found to be the most desirable as opposed to the circular shapes of loops 201 and 203. The width of the square loop, designated as 204, should be large enough so as to enclose as much of the magnetic field from the circuit lead being measured as is practical. Since this magnetic field falls off rapidly with distance from the wire being measured, it has been found that a one-inch square loop works well in typical electronic applications. It should be noted that the right angle bends at corners 205 and 206 advantageously define a portion of loop 202 over which a voltage is induced. Specifically, a voltage is induced only in side 207. Sides 208 and 209 are at right angles to wire 200 so that no voltage is induced in these sides and side 210 is too remote from wire 200 to have any significant signal induced by wire 200. Finally, a straight shape for side 207 maximizes the induced voltage for measurement of straight conductors.

The pickup loop should be connected to a scope or other measuring instrument preferably through a length of coaxial cable. In addition, for any cable characteristic impedance, the coaxial cable should be terminated in an element having the cable's characteristic impedance.

The termination is necessary to properly terminate the coaxial cable when its length is more than one-tenth of the smallest noise signal wavelength appearing in the circuit under test. In addition, where the length of the coaxial cable is less than one-tenth of the noise signal wavelength appearing in the circuit under test, the termination also serves to lower the Q of the tuned circuit consisting of the capacitance of the coaxial cable and the inductance of the pickup loop. For example, for several feet of 50 ohm coaxial cable having 100 pF of capacitance and a one-inch square loop having about 80 nH of inductance, the resonant frequency will be approximately 60 MHz. Most of the measurements made with such a loop will have frequency components in this range and above. If the 50 ohm termination is missing, each impulse induced in the loop will result in a damped ringing response that will render the loop useless for measurement purposes.

FIGS. 3 and 4 show two embodiments of noise probe pursuant to the present invention. As shown in FIG. 3, the pickup loop 300 comprises one turn of wire formed in the shape of a square from the center conductor of coaxial cable 301 and lying in the plane of the paper. One or more additional turns could be added so that the center conductor is formed into a multi-turn coil before it is tied to the ground shield of the coaxial cable. Use of a multi-turn coil increases the voltage picked up by the loop. In any event, the loop is formed from the center conductor of coaxial cable 301 and extends from the same to the ground shield 302 of this cable. In this embodiment, the ground shield has been cut back so that the loop of wire is exposed. In contrast, in the embodiment shown in FIG. 4, the ground shield is also extended and covers substantially all of the center conductor forming the loop except for a small gap 401. Such a gap is necessary to avoid forming a short-circuited turn of the ground shield of the coaxial cable. Except for this difference, the embodiment of FIGS. 3 and 4 are identical. The shielding of the center conductor in the embodiment of FIG. 4 is particularly advantageous in applications where there is a strong electric field. In such situations, the strong electric field in the absence of the ground shield cover in FIG. 4 can induce voltages into the center conductor which are comparable in amplitude to the intended magnetic field induction. This produces significant measurement errors. The disadvantage of such a cover, however, is that it places the center conductor of the loop at a greater distance from the circuit under test which, in turn, reduces the voltages induced in the loop.

In either the embodiment of FIG. 3 or 4, the coaxial cable is preferably wrapped several times through a ferrite core. This wrapping of the coaxial cable creates a low-pass filter for longitudinal signals, i.e., signals induced into the coaxial cable conductors which flow in the same direction, such as those from electric field pickup, and which are yet another source of measurement errors.

Figure 5:
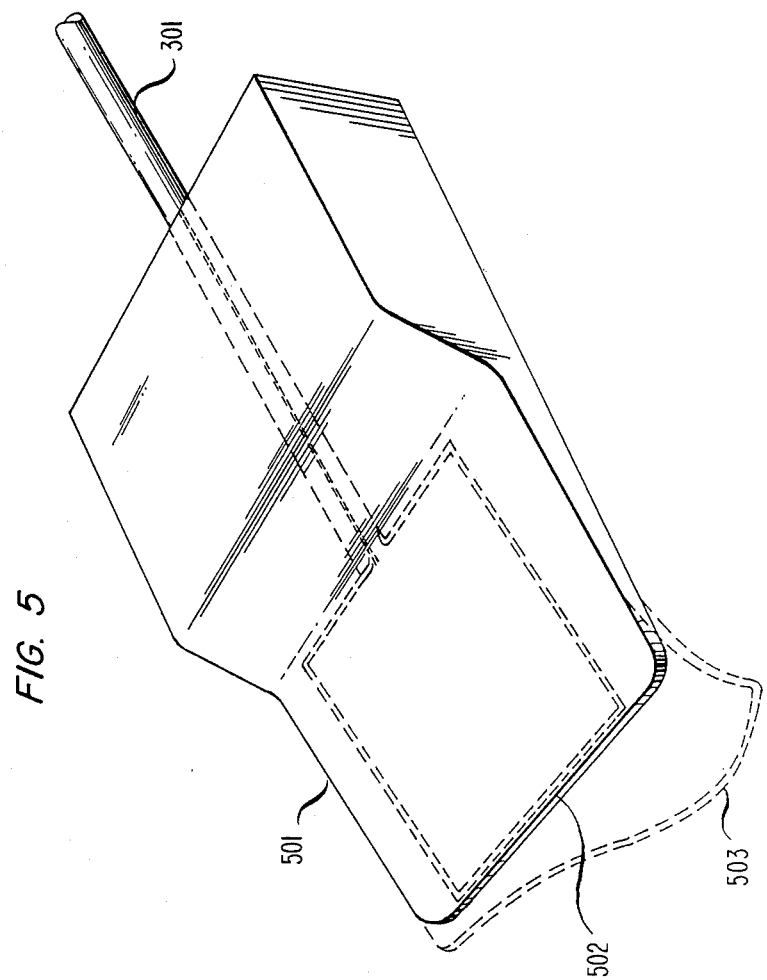
FIG. 5 is a perspective view of still another embodiment of the present invention.

FIG. 5 shows a perspective view of another arrangement of a noise probe in accordance with the present invention. The pickup loop alone or this loop and the wrapped ferrite core can be encased within a non-conductive housing 501. Preferably, this housing is tapered at end 502 so that this end can be moved into close proximity to the electrical conductors on a circuit board tightly packed with components. Moreover, this housing can be fabricated out of an elastic material so that the end 502 can be distorted as shown by dotted line 503 so that side 207 of the loop can follow the path of the conductor in the circuit under test being monitored. This deformation, while retained for the duration of the test, is elastic so that repeated and different deformations can be made to the side 207. While the deformation of side 207 can be done without the need for the flexible housing, the addition of such a housing adds structural rigidity to the loop and advantageously controls the amount of deformation imparted to avoid loop breakage.

The disclosed noise probe can be used for measuring noise voltages, determining noise margins and tracing noise currents. Advantageously, use of the probe does not disturb circuit operation since no electrical contact is made to the circuit under test and the magnetic coupling of energy into the loop is typically too small to affect circuit operation.

A lower bound for the noise voltage induced across a lead on a circuit can be measured by holding the loop over the lead being tested. The scope to which the noise probe is connected will display the noise voltage per unit length of the tested lead, the length being the length of the side of the pickup loop which is parallel and closest to the tested lead. For a multi-turn loop, this noise voltage per unit length is obtained by dividing the oscilloscope reading by the number of turns which have been formed in the pickup loop.

Mutual inductance falls off quickly with distance between two wires and, as a result, the present noise probe is selective enough to provide an indication of which lead in a bundle in a circuit under test contains the noise signal. The noise probe will display the largest amplitude signal from the lead which is directly beneath the pickup loop.

As with any measurement with an oscilloscope probe, it is advantageous to confirm that the displayed waveform is real, i.e., it is due to a current in the circuit path beneath the noise probe. It is possible for a capacitively coupled signal to be picked up by an unshielded loop. To determine if this has occurred, the noise probe should be rotated through 180 degrees while the probe end is maintained at a constant distance from the circuit lead. If the displayed waveform on the scope is indeed one which has been magnetically induced in the probe, the waveform will invert as the probe is rotated.

It is also possible for stray magnetic fields from strong sources, such as electrostatic discharge, to induce signals into the pickup loop. This can be determined by simply moving the loop away from the circuit under test. At a distance of several inches there should be little or no displayed signal.

The present noise probe can also be used to identify sources of noise in a circuit. In this application, two noise probes, each incorporating the disclosed pickup loop, are used. A dual trace scope is utilized and each loop is displayed on a separate trace. The first loop is used to pick up the noise in the circuit under test and is maintained in a fixed position relative to the circuit under test while the second loop is moved slowly over the circuit under test. This first loop serves as a stable triggering source so that phase as well as amplitude information may be obtained from the second loop. Assuming identical pickup loops on each noise probe, the displayed reading for each probe will be substantially the same when the probes are close to one another. As the second probe is moved away from the first, the displayed reading for the second probe will change, and as the noise source is approached, the displayed waveform will often go to zero and then exhibit a phase reversal at the source of the noise. In still other test arrangements, one noise probe, connected to a signal generator, can be used to inject noise into the circuit. By monitoring the level of injected noise at which the circuit ceases to operate satisfactorily, the noise margin can be determined. In addition, with one probe injecting noise into the circuit under test, a second probe connected to measurement apparatus can be moved over the circuit so that the paths that the injected noise follows can be determined.

It should, of course, be understood that while the present invention has been described in terms of the disclosed embodiments, other arrangements will be apparent to those skilled in the art. For example, while the disclosed embodiments utilize a coaxial cable and such use provides the greatest measurement accuracy, a plurality of conductors can be used in lieu of the coaxial cable. In such an event, one or more of these conductors conducts the measurement or injected noise signal and at least one other conductor conducts ground. In other arrangements, the pickup loop can be separately formed and conductively joined to the conductors or coaxial cable instead of being an extension of the probe conductors or coaxial cable.

I claim:

1. A probe for use with electrical measurement apparatus, said probe comprising
   a plurality of electrical conductors, at least one of said conductors being adapted to couple a signal between an end of said probe and said apparatus and at least one other of said conductors being adapted to couple ground between said probe end and said apparatus; and
   at least one loop of an electrically conductive material formed at said end, said loop connecting said one of said conductors to said other one of said conductors, said loop including a portion which is substantially straight and has a length sufficiently small to enable said portion to pick up signals from a circuit under test by magnetic induction and to determine which conductors in a group of such conductors in said circuit under test conduct a noise signal.

2. The probe of claim 1 wherein said plurality of electrical conductors respectively are a center conductor and a ground shield of a coaxial cable.

3. The probe of claim 2 wherein said loop of conductive material is formed from said center conductor.

4. The probe of claim 1 wherein said portion has two ends and each end of said portion is formed into an angle which is substantially 90°.

5. The probe of claim 4 wherein said loop is rectilinear.

6. The probe of claim 4 wherein said loop is square.

7. The probe of claim 1 wherein said loop of conductive material is substantially covered by said other one of said conductors.

8. The probe of claim 1 further comprising a ferrite core around a section of which each of said plurality of conductors is wrapped at least one time.

9. A method comprising the steps of
   coupling an electrical probe to electrical apparatus, said probe including a plurality of conductors, at least one of said conductors coupling a signal between a probe end and said apparatus, and at least one other one of said conductors coupling ground between said probe end and said apparatus, and at least one loop of conductive material connecting said one of said conductors to said other one of said conductors, said loop forming a plane and having a portion which is substantially straight; and locating said probe relative to a circuit to be tested in such a way that said plane of said loop overlies and is substantially perpendicular to said circuit and said loop is in close proximity to, but not in contact with, said circuit.

10. The method of claim 9 wherein said electrical apparatus is a signal generator and wherein in said coupling step said probe injects a noise signal into said circuit.

11. The method of claim 9 wherein said apparatus is a measurement device and wherein in said coupling step said probe picks up a noise signal from said circuit.

12. A probe for use with electrical apparatus, said probe comprising a plurality of electrical conductors, at least one of said conductors being adapted to couple a signal between an end of said probe and said apparatus and at least one other one of said conductors being adapted to couple ground between said probe end and said apparatus; and at least one loop of an electrically conductive material formed at said end, said loop connecting said one of said conductors to said other one of said conductors, said loop forming a plane and including a portion which is deformable within said plane, so that said portion can be distorted to follow a path of a conductor to be evaluated.

13. The loop of claim 12 further comprising a flexible housing which encases said loop portion.

14. A method comprising the steps of coupling an electrical probe to an electrical apparatus, said probe including a plurality of conductors, at least one of said conductors coupling a signal between a probe end and said apparatus, and at least one other one of said conductors coupling ground between said probe end and said apparatus, and at least one loop of conductive material connecting said one of said conductors to said other one of said conductors, said loop forming a plane and having a deformable portion so that said portion can follow a path of a conductor in a circuit to be tested; and locating said probe relative to said circuit to be tested in such a way that said plane of said loop is substantially perpendicular to said circuit and said loop of conductive material is in close proximity to, but not in contact with, said circuit.

* * * * *